United States Patent [19]

Schuessler

[11] 4,159,221

[45] Jun. 26, 1979

[54] METHOD FOR HERMETICALLY SEALING AN ELECTRONIC CIRCUIT PACKAGE

[75] Inventor: Philipp W. H. Schuessler, Endwell, N.Y.

[73] Assignee: International Business Machines Corporation, Armonk, N.Y.

[21] Appl. No.: 854,565

[22] Filed: Nov. 25, 1977

Related U.S. Application Data

[63] Continuation-in-part of Ser. No. 643,978, Dec. 24, 1975, abandoned.

[51] Int. Cl.² .............................................. B29C 17/00
[52] U.S. Cl. ..................................... 156/285; 156/286; 156/292; 156/330; 174/17.05; 174/52 S; 174/50.62; 174/52 FP; 264/85; 264/101; 264/516; 357/74; 357/80
[58] Field of Search ................. 156/330, 89, 152, 155, 156/156, 247, 281, 292, 300, 285, 286, 307, 308, 309, 314, 344, 382; 428/414, 415, 901; 260/30.2, 37 EP; 174/17.05, 50, 62, 52 S, 52 FP; 29/588; 357/74, 80, 78; 206/328, 332; 53/12, 39, 37; 264/85, 92, 101, 102, 236, 248, 272, 347

[56] References Cited

U.S. PATENT DOCUMENTS

| | | | |
|---|---|---|---|
| 2,915,490 | 12/1959 | Hopper et al. | 156/330 |
| 3,077,639 | 2/1963 | Siner et al. | 174/525 |
| 3,336,257 | 8/1967 | Alvey | 260/37 EP |
| 3,341,649 | 9/1967 | James | 264/272 |
| 3,383,260 | 5/1968 | Mojonnier | 156/304 |
| 3,522,121 | 7/1970 | Lorecock et al. | 156/330 |
| 3,711,939 | 1/1973 | Stoll | 156/285 |
| 3,749,601 | 7/1973 | Tittle | 428/414 |
| 3,943,623 | 3/1976 | Mizutani et al. | 156/330 |

OTHER PUBLICATIONS

Schuessler, "Thermal Bonding System", IBM Technical Disclosure Bulletin, vol. 17, No. 7, 12/1974, (156/285).

Primary Examiner—John T. Goolkasian
Assistant Examiner—J. J. Gallagher
Attorney, Agent, or Firm—Cyril A. Krenzer

[57] ABSTRACT

A hermetically sealed electronic circuit package is formed by placing a preformed, uncured sealant between a circuitized ceramic substrate and a ceramic cover. The resultant assembly is placed in an oven which has been preheated to a temperature at least as great as the curing temperature of the sealant and the oven is then evacuated. Before the sealant reaches its melting temperature, the oven is backfilled with nitrogen and stabilized at atmospheric pressure. The assembly is maintained in the heated environment for a period of time sufficient to substantially cure the sealant. The resulting assembly may be opened to affect any repairs that may become necessary and then reassembled.

7 Claims, 6 Drawing Figures

METHOD FOR HERMETICALLY SEALING AN ELECTRONIC CIRCUIT PACKAGE

CROSS REFERENCE TO RELATED APPLICATION

This application is a continuation-in-part of application Ser. No. 643,978 filed Dec. 24, 1975, now abandoned.

BACKGROUND OF THE INVENTION

1. Field of the Invention

This invention is directed to an improved method for packaging electronic circuits, and more particularly, to an improved method for providing a hermetically sealed electronic circuit package.

2. Prior Art

With the advent of large scale integration (LSI) technology, it is not uncommon to find complicated multi-circuit subsystems contained within a single LSI chip. Further, it has become increasingly desirable to mount a number of such chips on a single circuitized substrate, thereby forming a small system configuration. To improve the life and reliability of such a configuration, it is desirable to provide a housing for enclosing the single or multichip configuration on the circuitized substrate. The housing or cap must provide a hermetic seal around the chip or chips on the substrate, and desirably the housing is removable to permit access to any one of the chips that may become faulty to facilitate its repair.

In the prior art it has been conventional to form such a package by mounting chips on a ceramic substrate, providing an inert gas atmosphere around the chips and hermetically sealing a ceramic cap, or the like, over the chips on the substrate. A typical time/temperature curve for such a process is shown in FIG. 1, labeled prior art. The circuitized substrate with the chips soldered thereon is capped by a cover with a sealant material placed between the cover and the substrate. Then the entire configuration at ambient temperature is placed in a vacuum. The temperature is initially raised above the melt temperature of the sealant, but below its cure temperature for a specified period of time to enable the surface of the substrate and the bottom of the cover to become properly wetted by the flow of the sealant. Then, the entire configuration is backfilled with an inert gas, such as nitrogen, and the temperature is raised to a point equal to or above the cure temperature of the sealant material, where the assembly is kept for a prescribed period of time until the sealant was effectively cured.

Units made in accordance with this technique have evidenced a number of problems which have lead to a very low yield for such assemblies, thereby adversely affecting their costs. It was quite often found that pin holes were created in the sealant during the backfilling of the inert gas. Sometimes during the backfilling with the inert gas, because of unequal pressures between the inner part of the package and the outside thereof, a splattering of the sealant material occurred, damaging the chips contained within the package. This, of course, substantially diminishes the reliability of the units. It has also been found that there is a tendency to have an excessive internal flow of the sealant in a manner such that the sealant may be drawn underneath the chip. Then during subsequent temperature cycling of the chip, because of the differing coefficient of expansion between the sealant and the bond of the chip, the bond between the chip and the substrate could be broken.

Rather than using a flow type material, other types of seals are made by brazing or welding techniques to secure the cover to the substrate, but such techniques make it difficult to remove the cover from the substrate prior to repairing or replacing any of the chips on the multichip ceramic substrate.

A method related to the method of the present invention is found on page 1924 of the IBM Technical Disclosure Bulletin, Vol. 17, No. 7, dated Dec. 1974, (but actually published less than one year before the filing date of this application) in the article entitled "Thermal Bonding System" by P. W. Schuessler.

OBJECTS AND SUMMARY OF THE INVENTION

It is a principal object of the present invention to provide an improved method for hermetically sealing electronic circuit packages which overcome the disadvantages of the prior art.

A more specific object of the present invention is to provide an improved method for hermetically sealing electronic circuit packages which is both economical and reliable.

Yet another object of the present invention is to provide an improved method for hermetically sealing electronic packages which results in a package that can be disassembled to permit repair of the enclosed components in the package.

The foregoing and other objects are accomplished according to one aspect of the invention wherein a ceramic substrate having a number of LSI chips mounted thereon and a ceramic cover are placed proximate one another with a sealant material placed therebetween, the sealant material being a form of epoxy which can be easily dissolved, even after it has been cured. The cover and substrate with the sealant therebetween are placed in a preheated vacuum-chamber oven. A backfilling with an inert gas, such as nitrogen, is implemented quickly to accomplish a final backfill at an atmospheric pressure before the sealant reached its melt temperature. The temperature of this ceramic substrate, cover and sealant assembly continually rises up to or above the cure temperature of the sealant, which temperature is maintained for a period of time sufficient to cure the sealant.

The foregoing and other objects, features and advantages of the invention will be apparent from the following more particular description of preferred embodiments of the invention, as illustrated in the accompanying drawings.

DETAILED DESCRIPTION OF THE PREFERRED EMBODIMENTS

Figure 1:
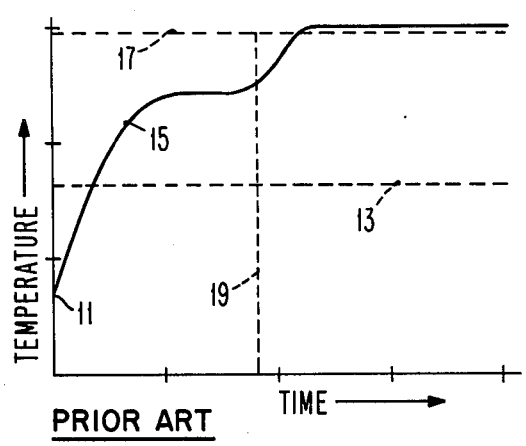
FIG. 1 is a time/temperature curve representative of a method of the prior art for forming a hermetically sealed electronic circuit package.

Referring first to FIG. 1, there is represented a time/temperature curve for a method of hermetically sealing an electronic package typical of the prior art. At time zero and at ambient temperature represented by the point 11 on the curve, the to be sealed package was placed in an evacuated oven and the temperature of the package was raised above the melt temperature 13 of the sealant to a temperature 15 which was below the cure temperature represented by the line 17 of FIG. 1. The package was maintained at the temperature 15 for a prescribed period of time, such as, for example, 40 minutes, to promote wetting of the surface of the substrate and the bottom of the cap to purportedly improve the ultimate seal of the package. At the end of the period of time and just as the temperature has begun to be raised toward the cure temperature, the oven was backfilled with an inert gas, such as nitrogen, at the time represented by line 19. Once the temperature of the assembly in the oven reached the cure temperature, it was held there perhaps for a sufficient period of time to effect substantial curing of the sealant.

Figure 2:
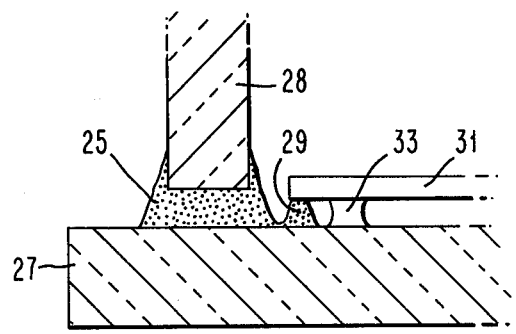
FIG. 2 is a partial, sectional view of a hermetically sealed electronic circuit package illustrating the problem encountered when using the method of the prior art.

One of the difficulties inherent in the foregoing method of the prior art is illustrated in FIG. 2. What has occurred is that the sealant 25 between the substrate 27 and cover 28 has flowed excessively on the surface of the substrate 27 in a manner such that a portion of the sealant 29 is drawn, for example by capillary action, into a position between the bottom of the chip 31 and the top of the substrate 27. After curing and during subsequent recycling between temperature extremes of the package, because of the different temperature coefficients of the sealant 29, and the solder 33, excessive forces were exerted on the solder 33 between the chip 31 and the substrate 27 causing it to break, thereby damaging the circuitry. Also it was found that because the backfilling occurred while the sealant 25 was in a melt state, there could be splattering of the sealant onto the chip surface and, in addition, there could be pin holes (not shown) formed in the sealant 25 which would ultimately permit a gradual escape of the inert gas enclosed in the package.

Figure 3:
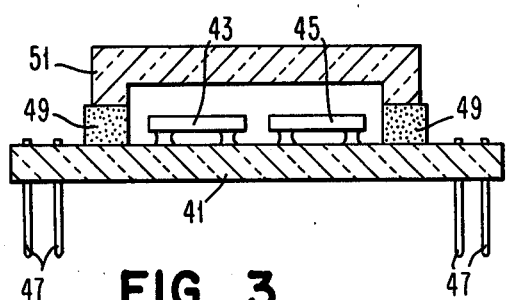
FIG. 3 is a sectional view of an electronic circuit package prior to being hermetically sealed according to the present invention.

Referring next to FIG. 3, there is shown an electronic circuit package assembly according to the present invention prior to being hermetically sealed. A ceramic substrate 41 is suitably circuitized (not shown) on the upper surface thereof and a plurality of chips 43, 45 are bonded on the circuitized surface. Pins 47 are positioned along the edge of the ceramic substrate. A sealant 49 is provided around the outer periphery of the chips 43, 45 and mated with a cover 51 which is placed thereover. The preassembled configuration is then placed into a suitable jig or holding device, perhaps with a number of other such preassembled packages, and is then placed in an oven. The oven is preferably preheated to a temperature at or above the cure temperature of the sealant 49. The doven is quickly evacuated to a near vacuum.

Figure 4:
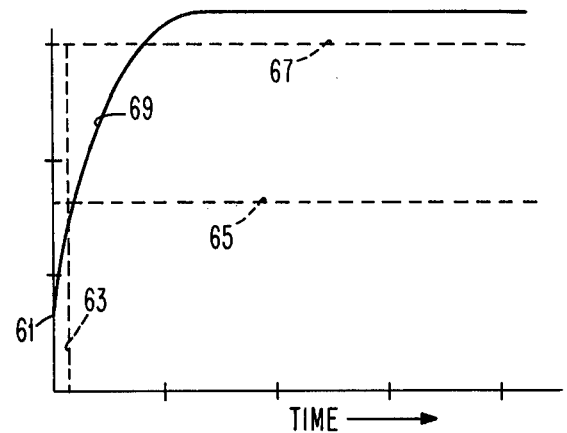
FIG. 4 is a time/temperature curve illustrative of the method of the present invention for hermetically sealing an electronic circuit package.

The time/temperature curve for the process according to the present invention is shown in FIG. 4. Point 61 is representative of the ambient temperature of the preassembled package as it is placed in the oven and evacuated. The temperature of the preassembled package is monitored or calculated so that the backfilling with an inert gas indicated by the point 63 on the time axis of FIG. 4 occurs before the temperature of the preassembled package reaches the melt point of the sealant, which temperature is represented by the line 65 of FIG. 4. It is imperative that the backfilling with the inert gas be accomplished prior to reaching the melt temperature 65 and that the pressure inside the cover be approximately equalized with the pressure in the chamber prior to the melt point of the sealant being reached. After backfilling with the inert gas, preferably to atmospheric pressure, the temperature of the assembly continues to rise until it reaches or exceeds the cure temperature 67 of the sealant 49. Therefore, the desired time and temperature curve is that represented by curve 69 of FIG. 4. The packaged assembly is then left in the inert gas atmosphere at the curing temperature for a sufficient period of time to substantially cure the sealant material.

Figure 5:
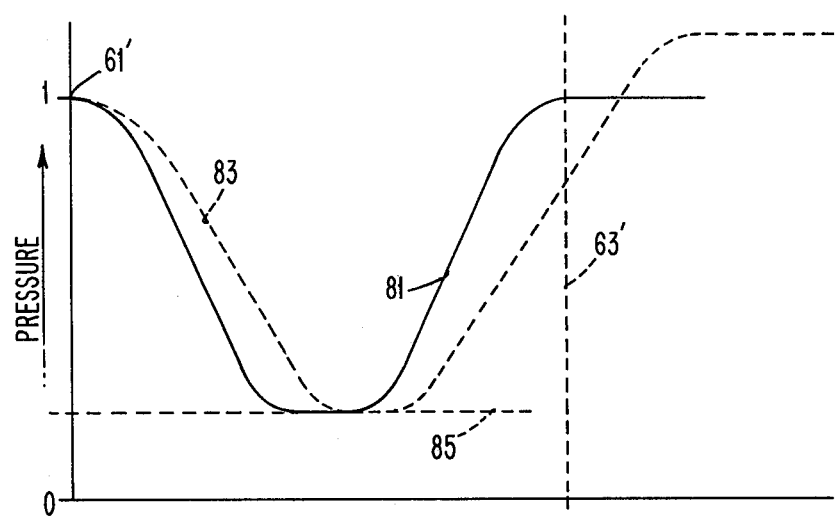
FIG. 5 is a time/pressure curve illustrative of the method of the present invention for hermetically sealing an electronic circuit package.

FIG. 5 represents the corresponding time/pressure curves for the process according to the invention. The time scale in FIG. 5 has been expanded relative to that of FIG. 4 to illustrate the differences between the pressure within the oven as illustrated by curve 81 and the pressure within the modules as illustrated by the curve 83. It takes a slightly longer time to evacuate the space within the modules compared to the evacuation of the space within the oven, and it takes a slightly longer time to backfill the space in the modules as compared to the total backfilling within the oven. Soon after the time 61' that the devices are placed in the oven, the evacuation of the air from within begins. An initial slight pressure differential occurs as mentioned above. The air is evacuated until a minimal pressure 85 is reached and the pressure is maintained at this level until the equilibrium is obtained between curves 81 and 83. Thereafter, backfilling with the inert gas begins as illustrated by the rising curves 81, 83, it being noted that the rise of pressure within the module somewhat lags the rise of pressure within the oven. It is important that the pressures within the module and in the oven during backfill equalize or are close to equalization at the time 63' when the epoxy begins to flow out and seal the module. After the sealing process occurs, there will be a slightly increased pressure within the module as compared to the pressure within the oven because the oven is held at a stabilized pressure, while the elevated temperature causes a slight increase in the pressure within the module.

Accordingly, it is noted that there must be a proper balancing and timing of the thermal input, the vacuum control and the backfilling with the inert gas in order to satisfactorily perform the sealing process according to the present invention.

In practicing the present invention it may be desirable and perhaps preferable to preform the sealant material on the bottom periphery of the cover 51 before mating the cover to the substrate 41, thereby minimizing handling problems, while assuring a better alignment between the cover and substrate. This may be done by die cutting the sealant to the desired shape from sheet stock. Then the gasket-like sealant is placed on the periphery of the inverted cover and subjected to a temperature above the melt temperature, but below the cure temperature of the sealant, for a short period of time, e.g., 100° C. for 10 minutes. The sealant thus flows onto and adheres to the periphery of the cover.

It has been found that an improved bond results if the substrate is cleaned prior to the assembling thereof with the cover and the preformed sealant material for subsequent placement in the oven. Any suitable solvents, such as N-methyl-2-pyrrolidone, which will not attack the circuitized substrate may be used for this purpose.

In carrying out the method of the invention, it is preferable that a uniform pressure be applied to the cover during the heating, sealing and curing of the cover to the ceramic substrate. This may be accomplished by placing a suitable weight on the cover when it is placed in the processing chamber. Typically a pressure of between one and one and a half pounds per square inch around the periphery of the cover is adequate.

Figure 6:
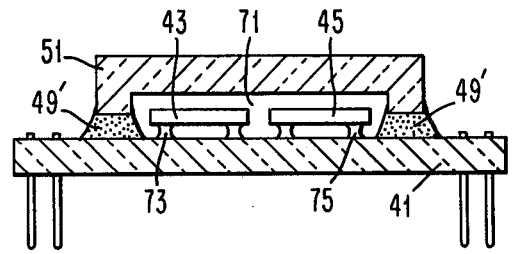
FIG. 6 is a sectional view of a hermetically sealed electronic circuit package formed in accordance with the method of the present invention.

Using a process according to the present invention will ideally result in a product as shown in FIG. 6. As can be seen during the heating cycle, the sealant material 49' has flowed slightly on the ceramic substrate 41 and up the walls of the cover 51. Also, the cap has settled down toward the substrate, but the relative parameters are chosen such that there still exists a suitable space 71 between the bottom of the cover and the top of the chips 43, 45, so that during subsequent recycling there is no chance of contact being made between the cover and the chips. With the method of the present invention, the interior flow of the sealant 49' is suitably restricted so that it does not contact the solder bonds 73, 75 connecting the chips 43, 45, respectively, to the substrate 41.

A suitable sealant for use in accordance with the present invention is an epoxy composition manufactured under the trade name Ablefilm 529, which is manufactured by Ablestik Laboratories. Ablefilm 529 is composed of approximately 300 parts by weight of Bisphenol-A basedepoxy resin, 30 parts of the hardner diaminodiphenyl sulfone, 12 parts of the accelerator 3(3',4'-dichlorophenyl)-1, 1-dimethyl/urea, 240 parts of a filler cupric oxide and 6 parts of a thixotropic silica.

Another suitable sealant material can be formed by combining a cross-linking agent, such as diaminodiphenylsulfone, with a basic epoxy resin, such as uncured Bisphenol-A, in combination with a filler (cuprous oxide or cupric oxide) and accelerator in accordance with the following proportions by weight:

Cross-linking Agent—4 to 5%
Basic Epoxy Resin—35 to 50%
Filler—40 to 55%
Accelerator—0.05 to 2%

These materials can be blended together in conjunction with a solvent such as acetone. During the blending operation, the acetone will be volatized off. Alternatively, the materials can be blended together at an elevated temperature, thereby obviating the need to use a solvent for the blending operation.

In preparing the sealant according to the above formula, it may be desirable to add a flow control agent such as a finely powdered silica in a proportion of 0 to 1.5%. The flow control agent is found to limit the spreading of the sealant 49' during the heating and curing operation.

Both the Ablefilm 529 and the materials made in accordance with the above-described formula are found to be readily soluble even after they have been cured. For example, N-methyl-2-pyrrolidone has been found to readily dissolve these sealants after curing, thereby providing a seal which can be subsequently removed if it is desired to repair or replace a damaged chip on the ceramic substrate. The N-methyl-2-pyrrolidone does not adversely affect the circuitization on the substrate or the chips.

It is, therefore, readily apparent that applicant has provided an improved method for fabricating hermetically sealed electronic circuit packages having many advantages over techniques of the prior art. Using the applicant's method, it is also noted that the time for assembling and curing the packages decreases, since the package is immediately taken up to the cure temperature, rather than spending a predetermined time at some intermediate temperature. It is also apparent that the assembly will reach the cure temperature more rapidly by backfilling the evacuated chamber at an earlier time, since the heat transfer through the inert gas is much more rapid than the radiation transfer that occurs in an evacuated chamber.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a hermetically sealed electronic circuit package, said package including a circuitized substrate, at least one integrated circuit chip mounted on said substrate and a cover adapted to be positioned and sealed over said chip on said substrate, said method comprising the steps of:

providing a preformed epoxy resin based sealant material between said circuitized substrate and the outer periphery of said cover;

placing the circuitized substrate and the cover with the preformed sealant therebetween is a vacuum chamber preheated to a temperature at least equal to the curing temperature of said sealant;

evacuating said chamber while continuously raising the temperature of said substrate, cover and sealant toward a temperature at least equal to the cure temperature of said sealant;

backfilling said chamber with an inert gas, chosen from the class consisting of nitrogen, argon, helium and neon, said backfilling being completed prior to the time the temperature of said sealant reaches its melting point; and maintaining said substrate, cover and sealant in said chamber at a temperature at least equal to the cure temperature of said sealant until said sealant is substantially cured.

2. The method according to claim 1 wherein said sealant is preformed on the periphery of said cover.

3. The method according to claim 1 wherein said sealant is soluble in selected solvents after being cured to thereby permit easy removal of said cover to facilitate repair of said circuitized substrate.

4. The method according to claim 3 wherein prior to curing said sealant by weight comprises:
4 to 5 percent diaminodiphenyl-sulfone;
35 to 50 percent Bisphenol-A epoxy resin having an average molecular weight between 900 and 1400;
40 to 55 percent of an oxide chosen from the class of cuprous oxide and cupric oxide;
0.05 to 2 percent of an accelerator, and
0 to 1.5 percent of a flow control agent.

5. The method according to claim 3 wherein said solvent is N-methyl-2-pyrrolidone.

6. The method according to claim 1 wherein a weight is placed on said cover to thereby exert a predetermined pressure by the periphery of said cover on said sealing material and substrate.

7. The method according to claim 1 wherein said backfilling of said chamber with an inert gas is done to substantially atmospheric pressure.

* * * * *